United States Patent
Ma

(10) Patent No.: US 10,825,946 B2
(45) Date of Patent: Nov. 3, 2020

(54) PHOTOELECTRIC DETECTOR AND PHOTOELECTRIC DETECTION DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 215 days.

(21) Appl. No.: 15/755,327

(22) PCT Filed: Jul. 21, 2017

(86) PCT No.: PCT/CN2017/093832
§ 371 (c)(1),
(2) Date: Feb. 26, 2018

(87) PCT Pub. No.: WO2018/054154
PCT Pub. Date: Mar. 29, 2018

(65) Prior Publication Data
US 2020/0013916 A1 Jan. 9, 2020

(30) Foreign Application Priority Data

Sep. 26, 2016 (CN) .......................... 2016 1 0851904

(51) Int. Cl.
*H01L 31/108* (2006.01)
*H01L 31/0224* (2006.01)

(52) U.S. Cl.
CPC .. *H01L 31/1085* (2013.01); *H01L 31/022408* (2013.01)

(58) Field of Classification Search
None
See application file for complete search history.

(56) References Cited

U.S. PATENT DOCUMENTS

2009/0071528 A1* 3/2009 Chen ................... H02S 30/20
136/246
2011/0156097 A1 6/2011 Maimon
(Continued)

FOREIGN PATENT DOCUMENTS

| CN | 101286535 | 10/2008 |
| CN | 102881728 | 1/2013 |

(Continued)

OTHER PUBLICATIONS

International Search Report and Written Opinion corresponding to International Patent Application No. PCT/CN2017/093832, dated Nov. 9, 2017.

(Continued)

*Primary Examiner* — Alexander G Ghyka
(74) *Attorney, Agent, or Firm* — Arent Fox LLP; Michael Fainberg

(57) ABSTRACT

The disclosure discloses a photoelectric detector and a photoelectric detection device, the photoelectric detector includes: a photosensitive active layer (100) including a first surface (1) and a second surface (2) opposite to each other; a first electrode (200) and a second electrode (300) located on the first surface (1) of the photosensitive active layer (100), and arranged spaced apart from each other; and a third electrode (400) located on the second surface (2) of the photosensitive active layer (100); where the first electrode (200) and the second electrode (300) respectively contact directly with the first surface (1) of the photosensitive active layer (100), and the third electrode (400) contacts directly with the second surface (2) of the photosensitive active layer (100). The photoelectric detector can improve the contrast between light current and dark current.

8 Claims, 2 Drawing Sheets

(56) References Cited

U.S. PATENT DOCUMENTS

| | | |
|---|---|---|
| 2011/0221019 A1 | 9/2011 | Patel et al. |
| 2012/0038013 A1 | 2/2012 | Karim et al. |
| 2014/0063583 A1 | 3/2014 | Lee et al. |

FOREIGN PATENT DOCUMENTS

| | | |
|---|---|---|
| CN | 103811568 | 5/2014 |
| CN | 105633283 | 6/2016 |
| CN | 106252454 | 12/2016 |
| CN | 206116433 | 4/2017 |

OTHER PUBLICATIONS

Office Action for Application No. 201610851904.4 dated May 3, 2017.

* cited by examiner

PHOTOELECTRIC DETECTOR AND PHOTOELECTRIC DETECTION DEVICE

CROSS-REFERENCE TO RELATED APPLICATIONS

This application is a National Stage of International Application No. PCT/CN2017/093832, filed Jul. 21, 2017, which claims priority to Chinese Patent Application No. 201610851904.4, filed Sep. 26, 2016, both of which are hereby incorporated by reference in their entireties.

FIELD

This disclosure relates to a photoelectric detector and photoelectric detection device.

BACKGROUND

In a Metal-Semiconductor-Metal (MSM) type photoelectric detector, a carrier depletion area like a PN junction is formed using a Schottky barrier at an interface between metal and a semiconductor. In the semiconductor, an external electric field is applied to photo-induced carriers generated from incident light, so that the photo-induced carriers drift into the carrier depletion area and then are collected rapidly by electrodes at both ends of the photoelectric detector. The MSM-structured photoelectric detector has been widely applied to various photo and particle detectors due to its characteristics of a simple structure, a low parasitic capacitance, a high response speed, a low fabrication cost, etc.

In the existing MSM-structured photoelectric detector, a horizontal electric field is generated when voltage is applied from the outside, so that an electron leakage channel is formed, and thus horizontal dark current in a dark state is increased, thus degrading the contrast between photo current and the dark current.

SUMMARY

At least one embodiment of the disclosure provides a photoelectric detector including: a photosensitive active layer including a first surface and a second surface opposite to each other; a first electrode and a second electrode located on the first surface of the photosensitive active layer, and arranged spaced apart from each other; and a third electrode located on the second surface of the photosensitive active layer, wherein the first electrode and the second electrode respectively contact directly with the first surface of the photosensitive active layer; and the third electrode contacts directly with the second surface of the photosensitive active layer.

For example, in the photoelectric detector above according to the at least one embodiment of the disclosure, an orthographic projection of the third electrode onto the photosensitive active layer overlies at least a part of an orthographic projection of the first electrode onto the photosensitive active layer and/or a part of an orthographic projection of the second electrode onto the photosensitive active layer.

For example, in the photoelectric detector above according to the at least one embodiment of the disclosure, the orthographic projection of the third electrode onto the photosensitive active layer overlies all of the orthographic projection of the first electrode onto the photosensitive active layer and/or all of the orthographic projection of the second electrode onto the photosensitive active layer.

For example, in the photoelectric detector above according to the at least one embodiment of the disclosure, the third electrode overlies all the second surface of the photosensitive active layer.

For example, in the photoelectric detector above according to the at least one embodiment of the disclosure, both the first electrode and the second electrode are slit electrodes, the first electrode includes at least one first sub-electrode, and the second electrode includes at least one second sub-electrode.

For example, in the photoelectric detector above according to the at least one embodiment of the disclosure, the at least one first sub-electrode and the at least one second sub-electrode are alternately arranged in a one-to-one manner, so that the first electrode and the second electrode constitute intersecting finger-shaped electrodes.

For example, in the photoelectric detector above according to the at least one embodiment of the disclosure, a material of the third electrode is a high-reflection nontransparent metal material.

For example, in the photoelectric detector above according to the at least one embodiment of the disclosure, the nontransparent metal material includes at least one of aluminum, copper, and molybdenum.

For example, in the photoelectric detector above according to the at least one embodiment of the disclosure, a material of the first electrode is a transparent conductive material, and/or a material of the second electrode is a transparent conductive material.

For example, in the photoelectric detector above according to the at least one embodiment of the disclosure, the transparent conductive material is a metal material with a high transmittance.

At least one embodiment of the disclosure further provides a photoelectric detection device including any one of the photoelectric detectors above; and a voltage drive circuit electrically connected with the first electrode, the second electrode, and the third electrode in the photoelectric detector respectively; wherein the voltage drive circuit is configured to apply different voltage to the first electrode and the second electrode.

For example, in the photoelectric detection device according to the at least one embodiment of the disclosure, the voltage drive circuit includes a first sub-voltage drive circuit, a second sub-voltage drive circuit, and a third sub-voltage drive circuit; the first sub-voltage drive circuit is electrically connected with the first electrode, and configured to apply voltage to the first electrode; the second sub-voltage drive circuit is electrically connected with the second electrode, and configured to apply voltage that is different from the voltage of the first electrode to the second electrode; and the third sub-voltage drive circuit is electrically connected with the third electrode, and configured to apply voltage to the third electrode.

For example, in the photoelectric detection device according to the at least one embodiment of the disclosure, the third sub-voltage drive circuit is configured to apply voltage that is different from the voltage of the first electrode and/or different from the voltage of the second electrode, to the third electrode.

For example, in the photoelectric detection device according to the at least one embodiment of the disclosure, there is a difference of greater than zero between a voltage difference between the third electrode and the first electrode, and a voltage difference between the third electrode and the second electrode.

For example, in the photoelectric detection device according to the at least one embodiment of the disclosure, the third sub-voltage drive circuit is configured to apply voltage that lies between the voltage of the first electrode and the voltage of the second electrode, to the third electrode.

For example, in the photoelectric detection device according to the at least one embodiment of the disclosure, the third sub-voltage drive circuit is configured to apply voltage that is greater than or equal to a higher one of the voltage of the first electrode and the voltage of the second electrode, to the third electrode.

For example in the photoelectric detection device according to the at least one embodiment of the disclosure, the third sub-voltage drive circuit is configured to apply voltage that is less than or equal to a lower one of the voltage of the first electrode and the voltage of the second electrode, to the third electrode.

BRIEF DESCRIPTION OF THE DRAWINGS

In order to make the technical solutions according to the embodiments of the disclosure more apparent, the drawings in the embodiments of the disclosure will be introduced below in brief, and apparently the drawings to be described below only relate to some embodiments of the disclosure, but are not intended to limit the disclosure thereto.

DETAILED DESCRIPTION OF THE EMBODIMENTS

Figure 1:
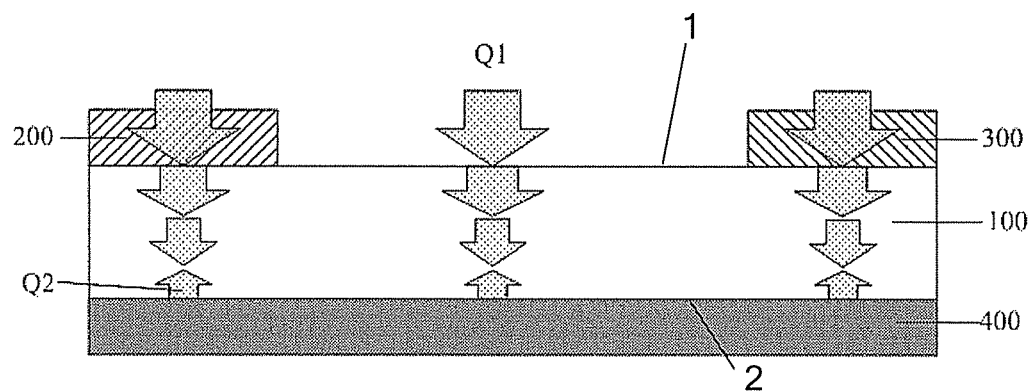
FIG. 1 is a schematic structural diagram of a photoelectric detector according to an embodiment of the disclosure in a sectional view.

In order to make the objects, technical solutions, and advantages of the embodiments of the disclosure more apparent, the technical solutions according to the embodiments of the disclosure will be described below clearly and fully with reference to the drawings in the embodiments of the disclosure. Apparently the embodiments to be described are only a part but not all of the embodiments of the disclosure. Based upon the embodiments here of the disclosure, all of other embodiments which can occur to those ordinarily skilled in the art without any inventive effort shall come into the scope of the disclosure as claimed.

Unless defined otherwise, technical terms or scientific terms throughout the disclosure shall convey their usual meaning as appreciated by those ordinarily skilled in the art to which the disclosure pertains. The term "first", "second", or the like throughout the disclosure does not suggest any order, number or significance, but is only intended to distinguish different components from each other. Alike the term "include", "include", or the like refers to that an element or an item preceding to the term encompasses an element(s) or an item(s) succeeding to the term, and its (or their) equivalence(s), but shall not preclude another element (s) or item(s). The term "connect", "connected", or the like does not suggest physical or mechanical connection, but may include electrical connection no matter whether it is direct or indirect. The term "above", "below", "left", "right", etc., is only intended to represent a relative positional relationship, and when the absolute position of an object as described is changed, the relative positional relationship may also be changed accordingly.

It shall be noted that the thicknesses, sizes, and shapes of respective layers in the drawings will not reflect any real proportion of a photoelectric detector, but are only intended to illustrate the disclosure by way of an example.

Figure 2:
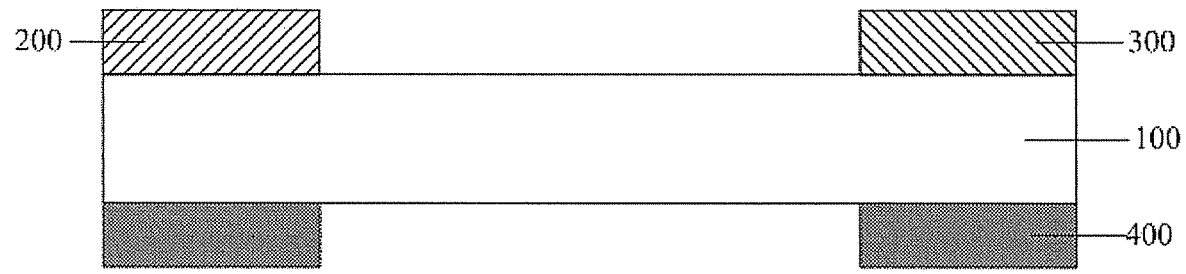
FIG. 2 is a schematic structural diagram of a photoelectric detector according to another embodiment of the disclosure in a sectional view.

At least one embodiment of the disclosure provides a photoelectric detector, as illustrated in FIG. 1 and FIG. 2, the photoelectric detector includes: a photosensitive active layer 100 including a first surface (1) and a second surface (2) opposite to each other, a first electrode 200 and a second electrode 300 located on the first surface (1) of the photosensitive active layer 100, and arranged spaced apart from each other; and a third electrode 400 located on the second surface (2) of the photosensitive active layer 100, where the first electrode 200 and the second electrode 300 respectively contact directly with the first surface (1) of the photosensitive active layer 100, and the third electrode 400 contacts directly with the second surface (2) of the photosensitive active layer 100.

It shall be noted that the first electrode 200 and the second electrode 300 respectively contact directly, and are electrically connected, with the first surface (1) of the photosensitive active layer 100, and the third electrode 400 contacts directly, and is electrically connected, with the second surface (2) of the photosensitive active layer 100.

For example, in the photoelectric detector above according to the at least one embodiment of the disclosure, the third electrode is arranged on a side of the photosensitive active layer facing away from the first electrode and the second electrode (i.e., the second surface), so that voltage different from voltage of the first electrode and/or different from voltage of the second electrode can be applied to the third electrode, thus an electric field is created between the third electrode, and at least one of the first electrode and the second electrode that the direction of a total electric field in the photoelectric detector is changed from the original horizontal direction to another direction, so an electron leakage channel is changed, and dark current arising from the horizontal electric field is lowered, so that when the photoelectric detector detects light, and generates light current, the contrast between the light current and the dark current can be improved.

For example, in the photoelectric detector above according to the embodiments of the disclosure, an orthographic projection of the third electrode 400 onto the photosensitive active layer 100 overlies at least a part of an orthographic projection of the first electrode 200 onto the photosensitive active layer 100 and/or an orthographic projection of the second electrode 300 onto the photosensitive active layer 100.

For example, in the photoelectric detector above according to the embodiments of the disclosure, as illustrated in FIG. 2, the orthographic projection of the third electrode 400 onto the photosensitive active layer 100 overlies at least all of the orthographic projections of the first electrode 200 and the second electrode 300 onto the photosensitive active layer 100. It shall be noted that the orthographic projection of the third electrode 400 onto the photosensitive active layer 100 can alternatively overly only all of the orthographic projection of the first electrode 200 onto the photosensitive active layer 100, or only all of the orthographic projection of the second electrode 300 onto the photosensitive active layer 100.

For example, in the photoelectric detector above according to the embodiments of the disclosure, as illustrated in FIG. 1, the third electrode 400 overlies the entire second surface (2) of the photosensitive active layer 100.

For example, a material of the photosensitive active layer is cadmium sulfide, cadmium selenium, or lead sulfide, etc.

Generally, photo-induced carriers are generated when incident light enters into the photosensitive active layer, and the intensity of the light decreases gradually as the light propagates deeper and deeper into the photosensitive active layer. At present, in order to enable the photosensitive active layer to absorb the light sufficiently, the photosensitive active layer needs to be made thick so that all of the light from the outside can be absorbed by the photosensitive active layer. However as the thickness of the photosensitive active layer increases, there is a significantly varying concentration gradient of the photo-induced carriers in the photosensitive active layer in a direction perpendicular to the photosensitive active layer, thus hindering the utilization ratio of the light from being improved. In view of this, in order to lower the thickness of the photosensitive active layer, in the photoelectric detector above according to the embodiments of the disclosure, a material of the third electrode 400 can be a high-reflection nontransparent metal material.

For example, when the material of the third electrode 400 is the high-reflection nontransparent metal material, as illustrated in FIG. 1, when incident light Q1 is incident onto the photosensitive active layer, the high-reflection third electrode 400 can be arranged on the second surface (2) of the photosensitive active layer 100 to reflect a part of light transmitted through the photosensitive active layer 100, i.e., reflected light Q2, so that the incident light Q1 is absorbed sufficiently by the photosensitive active layer 100 to thereby improve the utilization ratio of the light while lowering the thickness of the photosensitive active layer.

For example, in the photoelectric detector above according to the embodiments of the disclosure, the nontransparent metal material can include at least one of aluminum, copper, and molybdenum, although the embodiments of the disclosure will not be limited thereto.

Figure 3:
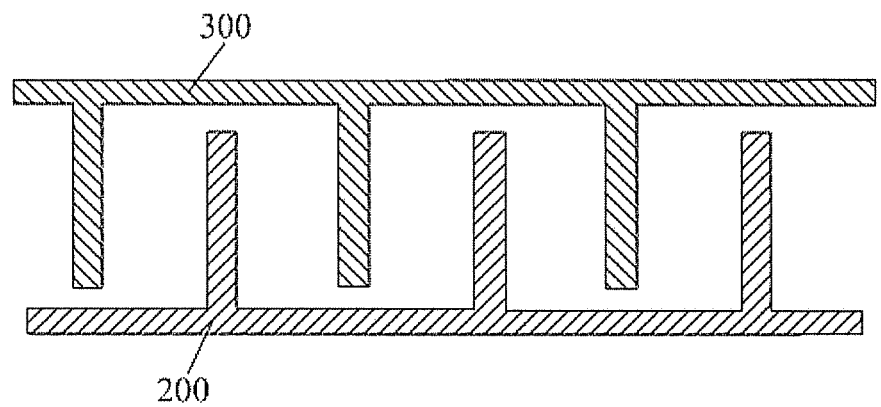
FIG. 3 is a schematic structural diagram of a first electrode and a second electrode according to an embodiment of the disclosure in a sectional view.

In order to improve a direct contact area of the light with the photosensitive active layer to thereby improve the absorption of the light by the photosensitive active layer, for example, in the photoelectric detector above according to the embodiments of the disclosure, both the first electrode 200 and the second electrode 300 are slit electrodes, where the first electrode 200 includes at least one first sub-electrode, and the second electrode 300 includes at least one second sub-electrode, as illustrated in FIG. 3.

For example, the at least one first sub-electrode and the at least one second sub-electrode are alternately arranged in a one-to-one manner, so that the first electrode 200 and the second electrode 300 constitute intersecting finger-shaped electrodes.

For example, in order to further improve the absorption of the light by the photosensitive active layer, in the photoelectric detector above according to the at least one embodiment of the disclosure, a material of the first electrode is a transparent conductive material; or in the photoelectric detector above according to the embodiments of the disclosure, a material of the second electrode is a transparent conductive material. Alternatively, in order to further improve the absorption of the light by the photosensitive active layer, in the photoelectric detector above according to the embodiments of the disclosure, the material of the first electrode 200 is the transparent conductive material, and the material of the second electrode 300 is the transparent conductive material, as illustrated in FIG. 1, so that the incident light Q1 can be transmitted through the first electrode 200 and the second electrode 300 into the photosensitive active layer 100 to thereby further improve the absorption of the light by the photosensitive active layer 100.

For example, in the photoelectric detector above according to the embodiments of the disclosure, the transparent conductive material can be a metal material with a high transmittance, e.g., gold with a thickness at a nanometer order, silver with a thickness at a nanometer order, etc., e.g., 10 to 500 nm, e.g., 10 nm, 100 nm, 200 nm, 300 nm, 400 nm, 500 nm, etc.

For example, the transparent conductive material can alternatively be one or any combination of an indium tin oxide (ITO) material, an indium zinc oxide (IZO) material, a carbon nanotube, and graphene, although the embodiments of the disclosure will not be limited thereto.

Figure 4:
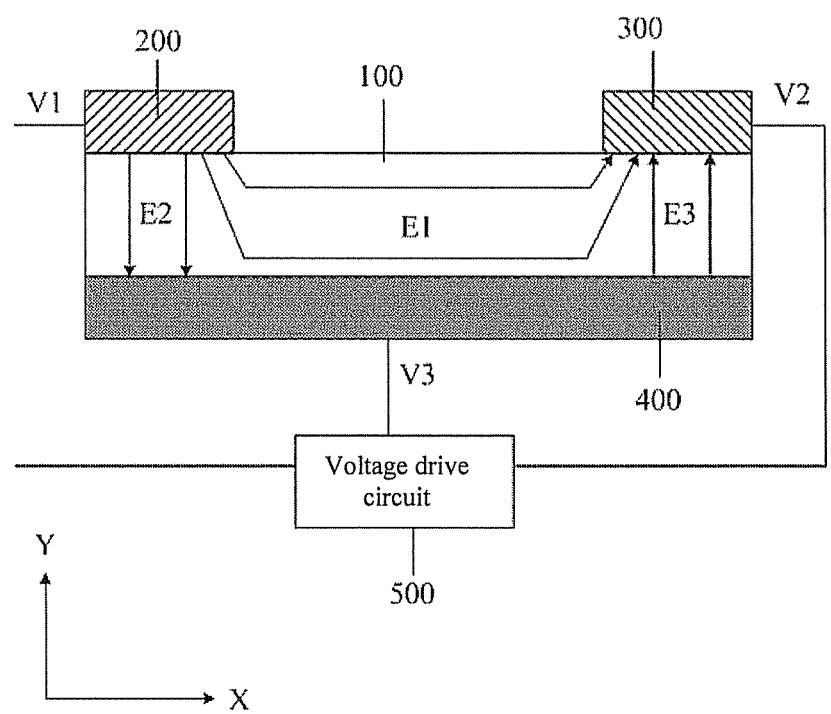
FIG. 4 is a schematic structural diagram of a photoelectric detection device according to an embodiment of the disclosure.

For example, the embodiments of the disclosure further provide a photoelectric detection device, as illustrated in FIG. 4, the photoelectric detection device includes the photoelectric detector according to any one of the embodiments above, and a voltage drive circuit 500 electrically connected with the first electrode 200, the second electrode 300, and the third electrode 400 in the photoelectric detector respectively. For example, the voltage drive circuit 500 can include a voltage division circuit, a gamma circuit, etc.

For example, the voltage drive circuit 500 is configured to apply different voltage to the first electrode 200 and the second electrode 300.

For example, the voltage drive circuit 500 is further configured to apply voltage V3 that is different from voltage V1 of the first electrode 200, and/or different from voltage V2 of the second electrode 300, to the third electrode 400.

For example, there is a difference of greater than zero between a voltage difference between the voltage V3 of the third electrode 400 and the voltage V1 of the first electrode 200, and a voltage difference between the voltage V3 of the third electrode 400 and the voltage V2 of the second electrode 300.

For example, in the photoelectric detection device above according to the embodiments of the disclosure, the voltage drive circuit can include a first sub-voltage drive circuit, a second sub-voltage drive circuit, and a third sub-voltage drive circuit.

For example, the first sub-voltage drive circuit is electrically connected with the first electrode, and configured to apply voltage to the first electrode; the second sub-voltage drive circuit is electrically connected with the second electrode, and configured to apply voltage to the second electrode; and the third sub-voltage drive circuit is electrically connected with the third electrode, and configured to apply voltage to the third electrode.

For example, the third sub-voltage drive circuit is configured to apply voltage that is different from the voltage of the first electrode and/or different from the voltage of the second electrode, to the third electrode.

For example, there is a difference of greater than zero between a voltage difference between the third electrode and the first electrode, and a voltage difference between the third electrode and the second electrode.

For example, the third sub-voltage drive circuit is configured to apply voltage that lies between the voltage of the first electrode and the voltage of the second electrode, to the third electrode.

For example, the third sub-voltage drive circuit is configured to apply voltage that is greater than or equal to a higher one of the voltage of the first electrode and the voltage of the second electrode, to the third electrode.

For example, the third sub-voltage drive circuit is configured to apply voltage that is less than or equal to a lower one of the voltage of the first electrode and the voltage of the second electrode, to the third electrode.

For example, in an example, the voltage applied to the first electrode is V1, the voltage applied to the second electrode is V2, and the voltage applied to the third electrode is V3; and when V1>V2, then V1>V3>V2, or V3≥V1, or V3≤V2.

When V2>V1, then V2>V3>V1, or V3≥V2, or V3≤V1.

For example, in an example, in the photoelectric detection device above according to the embodiments of the disclosure, as illustrated in FIG. 4, a direction of a plane where the photosensitive active layer 100 lies is the horizontal direction X, and a direction perpendicular to the plane where the photosensitive active layer lies is the vertical direction Y; and given V1>V3>V2 for example, there are a horizontal electric field E1 between the first electrode 200 and the second electrode 300 that is directed from the first electrode 200 to the second electrode 300, a vertical electric field E2 between the first electrode 200 and the third electrode 400 that is directed from the first electrode 200 to the third electrode 400, and a vertical electric field E3 between the second electrode 300 and the third electrode 400 that is directed from the third electrode 400 to the second electrode 300, so the directions of E1, E2, and E3 are different from each other. Furthermore there is a difference of greater than zero between the voltage difference between V1 and V3, and the voltage difference between V2 and V3, so E2 is different in magnitude from E3. Accordingly a direction of a total electric field resulting from superimposition of E1, E2, E3 onto each other is different from the direction of E1, so that electrons originally moving only in the direction of the horizontal electric field E1 are changed to move in the direction of the total electric field resulting from superimposition of E1, E2, E3, thus alleviating the electrons from flowing from the first electrode 200 to the second electrode 300 to thereby lower dark current between the first electrode 200 and the second electrode 300, thus when the photoelectric detection device detects the light, the contrast between the light current and the dark current can be improved.

The photoelectric detector and the photoelectric detection device according to the embodiments of the disclosure have at least one of the following advantageous effects.

(1) In the photoelectric detector and the photoelectric detection device according to the at least one embodiment of the disclosure, an electric field is generated between the third electrode, and at least one of the first electrode and the second electrode, so that the direction of the total electric field in the photoelectric detector is changed from the original horizontal direction to another direction to thereby change an electron leakage channel.

(2) The photoelectric detector and the photoelectric detection device according to the at least one embodiment of the disclosure can lower dark current arising from the horizontal electric field.

(3) In the photoelectric detector and the photoelectric detection device according to the at least one embodiment of the disclosure, when the photoelectric detection device detects the light, the contrast between the light current and the dark current can be improved.

It shall be noted that: (1) The drawings in the embodiments of the disclosure only relate to the structures as described in the embodiments of the disclosure, and other structures can be designed as usual.

(2) For the sake of clarity, the thicknesses of layers or areas are enlarged or narrowed in the drawings to which reference is made in the description of the embodiments of the disclosure, that is, these drawings are not drawn to actual scale. As can be appreciated, when an element, e.g., a layer, a film, an area, a substrate, etc., is referred to as being located "on" or "under" another element, the element may be located "directly" "on" or "under" the other element, or there may be an intermediate element between them.

(3) The embodiments of the disclosure and the features in the embodiments can be combined with each other into new embodiments unless they conflict with each other.

The foregoing description only relates to the particular embodiments of the disclosure, but the scope of the disclosure as claimed shall not be limited thereto. The scope of the disclosure as claimed shall be as defined in the appended claims.

This application claims the benefit of Chinese Patent Application No. 201610851904.4, filed Sep. 26, 2016, which is hereby incorporated by reference in its entirety.

The invention claimed is:

1. A photoelectric detector, comprising:
   a photosensitive active layer comprising a first surface and a second surface opposite to each other;
   a first electrode and a second electrode located on the first surface of the photosensitive active layer, and arranged spaced apart from each other; and
   a third electrode located on the second surface of the photosensitive active layer, wherein:
   the first electrode and the second electrode respectively contact directly with the first surface of the photosensitive active layer; and
   the third electrode contacts directly with the second surface of the photosensitive active layer;
   wherein both the first electrode and the second electrode are slit electrodes, the first electrode comprises at least one first sub-electrode, and the second electrode comprises at least one second sub-electrode; and
   wherein the at least one first sub-electrode and the at least one second sub-electrode are alternately arranged in a one-to-one manner, and the first electrode and the second electrode constitute intersecting finger-shaped electrodes.

2. The photoelectric detector according to claim 1, wherein an orthographic projection of the third electrode onto the photosensitive active layer overlies at least a part of an orthographic projection of the first electrode onto the photosensitive active layer and/or a part of an orthographic projection of the second electrode onto the photosensitive active layer.

3. The photoelectric detector according to claim 2, wherein the orthographic projection of the third electrode onto the photosensitive active layer overlies all of the orthographic projection of the first electrode onto the photosensitive active layer and/or all of the orthographic projection of the second electrode onto the photosensitive active layer.

4. The photoelectric detector according to claim 1, wherein the third electrode overlies all the second surface of the photosensitive active layer.

5. The photoelectric detector according to claim 1, wherein a material of the third electrode is a high-reflection nontransparent metal material.

6. The photoelectric detector according to claim 5, wherein the nontransparent metal material comprises at least one of aluminum, copper, and molybdenum.

7. The photoelectric detector according to claim 1, wherein a material of the first electrode is a transparent conductive material, and/or a material of the second electrode is a transparent conductive material.

8. The photoelectric detector according to claim 7, wherein the transparent conductive material is a metal material with a high transmittance.

* * * * *